United States Patent
Jung et al.

(10) Patent No.: US 10,834,347 B2
(45) Date of Patent: Nov. 10, 2020

(54) IMAGE SENSOR HAVING SEPARATE, STACKED, PIXEL ARRAY, DRAM, AND LOGIC/ANALOG-DIGITAL CONVERTER INTEGRATED CIRCUIT DIE

(71) Applicant: OmniVision Technologies, Inc., Santa Clara, CA (US)

(72) Inventors: Taehyung Jung, Santa Clara, CA (US); Hoon Ryu, Sunnyvale, CA (US); Zheng Yang, San Jose, CA (US); Hyunsu Yoon, San Jose, CA (US); Chia-Ming Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 61 days.

(21) Appl. No.: 16/133,449

(22) Filed: Sep. 17, 2018

(65) Prior Publication Data
US 2020/0092509 A1  Mar. 19, 2020

(51) Int. Cl.
*H04N 5/3745* (2011.01)
*H04N 5/369* (2011.01)
*H01L 27/146* (2006.01)

(52) U.S. Cl.
CPC ..... *H04N 5/37452* (2013.01); *H04N 5/37455* (2013.01); *H01L 27/1464* (2013.01); *H01L 27/14621* (2013.01); *H01L 27/14623* (2013.01); *H01L 27/14634* (2013.01); *H01L 27/14636* (2013.01); *H01L 27/14645* (2013.01)

(58) Field of Classification Search
None
See application file for complete search history.

(56) References Cited

U.S. PATENT DOCUMENTS

| | | | | |
|---|---|---|---|---|
| 6,321,266 | B1 * | 11/2001 | Yokomizo | H04N 1/32358 358/400 |
| 6,518,614 | B1 * | 2/2003 | Breitwisch | H01L 27/112 257/298 |
| 6,917,380 | B1 * | 7/2005 | Tay | H04N 5/367 348/247 |
| 2013/0215290 | A1 * | 8/2013 | Solhusvik | H04N 5/35572 348/231.99 |
| 2016/0093403 | A1 * | 3/2016 | Kim | G06F 11/0751 365/96 |
| 2017/0285101 | A1 * | 10/2017 | Whetsel | G01R 31/318536 |

* cited by examiner

*Primary Examiner* — Mark T Monk
(74) *Attorney, Agent, or Firm* — Lathrop GPM LLP

(57) ABSTRACT

A multiple IC, buffered, image sensor has a first IC with pixels, selection transistors, and interconnect coupling selected pixels with first inter-die bond pads that convey image data to a second IC having logic and ADCs. The ADCs having inputs coupled to selected pixels and outputting through-silicon vias and inter-die bond pads to a third IC coupled to buffer raw image data in DRAM. A method includes capturing images with array pixel IC divided into sub-arrays each coupled to a separate, associated, ADC through inter-die bonds, scanning the sub-arrays and converting the image data to digital image data; and transferring the digital image data over inter-die bonds into buffers in DRAM.

17 Claims, 4 Drawing Sheets

IMAGE SENSOR HAVING SEPARATE, STACKED, PIXEL ARRAY, DRAM, AND LOGIC/ANALOG-DIGITAL CONVERTER INTEGRATED CIRCUIT DIE

BACKGROUND

Image sensor arrays, such as those used in modern cameras and camera-phones, have a large number of pixels, each pixel typically including a photodiode. For example, a 4160×3328 image sensor has 13.8 million pixels, and high end cameras may have considerably more pixels. Each pixel, when read through an analog to digital converter (ADC), typically produces at least 8 bits of data, with ADCs producing 10, 12, or even 16 bits known in the art. A 4160×3328 array with 16-bit ADC may produce as much as 221 megabits of raw data for a single image. There is a market for cameras capable of capturing multiple high-resolution images in sequence; digital cameras capturing high resolution image bursts may capture enormous amounts of raw image data during each burst.

Many cameras have "Bayer"-pattern color filters, where pixels are grouped into cells of four pixels having three or four different color filters in each cell, giving three or four different pixel types in each cell. A color for each cell is typically computed during color processing from ratios of ADC results from the three or four different types of pixels of the cell.

Image sensors may have one or more defective pixels, or may have some sensors of slightly varying sensitivity.

Pixel arrays are often formed using integrated circuit (IC) fabrication processes that do not support fabrication of floating-gate multilayer-polysilicon one-time-programmable (OTP) memory devices on the same integrated circuit. OTP is a common nonvolatile memory and may store information such as identity of defective pixels or differences in sensitivity useful in color processing. Similarly, many dynamic random-access memory (DRAM) devices are fabricated using trench capacitors or cylinder capacitors that are not supported by most processes used to fabricate pixel arrays and other digital logic circuits. OTP memory devices in DRAM may be used to store information such as identity of defective DRAM cells and particular settings for control and timing circuitry for optimizing access.

OTP memory typically requires fairly high on-chip voltages for programming, these high voltages require portions of the circuit have larger diffusion-to-diffusion line spacing, well spacing, and otherwise consume more area per transistor on an integrated circuit than on other common integrated circuits. These larger dimensions, and relatively low "on" current, combine to make OTP memory slower to access than other memory devices. As a result, many designs using OTP memory are configured to copy OTP memory contents into static random-access memory (SRAM) memory to permit access through the faster-to-read SRAM cells.

SRAM cells typically require at least 6 transistors, or in some embodiments 4 transistors plus a pair of high-value polysilicon resistors, requiring considerably more area than DRAM memory cells require.

There are many other applications for systems that may combine some OTP memory with SRAM, where an area savings and memory increase, such as may be available with DRAM, may be beneficial.

Back-side imaging pixel arrays, where transistors are implanted into and metal interconnect layers are deposited onto a first side of the integrated array while each pixel is exposed to light through a second side of the integrated array, are sometimes preferred because the pixels are not obstructed by the metal interconnect layers. Such pixel arrays may, however, have differences in sensitivity between pixels with different color filters because of wavelength-dependent attenuation in silicon between the pixels and the second or back side of the integrated array.

In recent years, technology has been developed for bonding pixel array integrated circuit wafers to logic and support circuit integrated circuit wafers, these wafers are then cut into individual hybrid image sensors. Some of these hybrid image sensors have bonds communicating signals from individual pixels, or from a small group of pixels as selected by primary selection transistors, on the pixel array part of the hybrid to selection circuits and buffers located with decoders, drivers, analog-to-digital converters, and other circuitry located on the logic and support circuit portion of the hybrid. These are known herein as bond-per-pixel (BPP) image sensors even where there are a group of pixels associated with each bond to the logic and support circuit.

SUMMARY

In an embodiment, a multiple IC, buffered, image sensor has a first IC with pixels, selection transistors, and interconnect coupling selected pixels with first inter-die bond pads that convey image data to a second IC having logic and ADCs. The ADCs having inputs coupled to selected pixels and outputting through-silicon vias and inter-die bond pads to a third IC coupled to buffer raw image data in DRAM.

In an embodiment, a method includes capturing images with array pixel IC divided into sub-arrays each coupled to a separate, associated, ADC through inter-die bonds, scanning the sub-arrays and converting the image data to digital image data; and transferring the digital image data over inter-die bonds into buffers in DRAM.

DETAILED DESCRIPTION OF THE EMBODIMENTS

Pixel Embodiments

Figure 1:
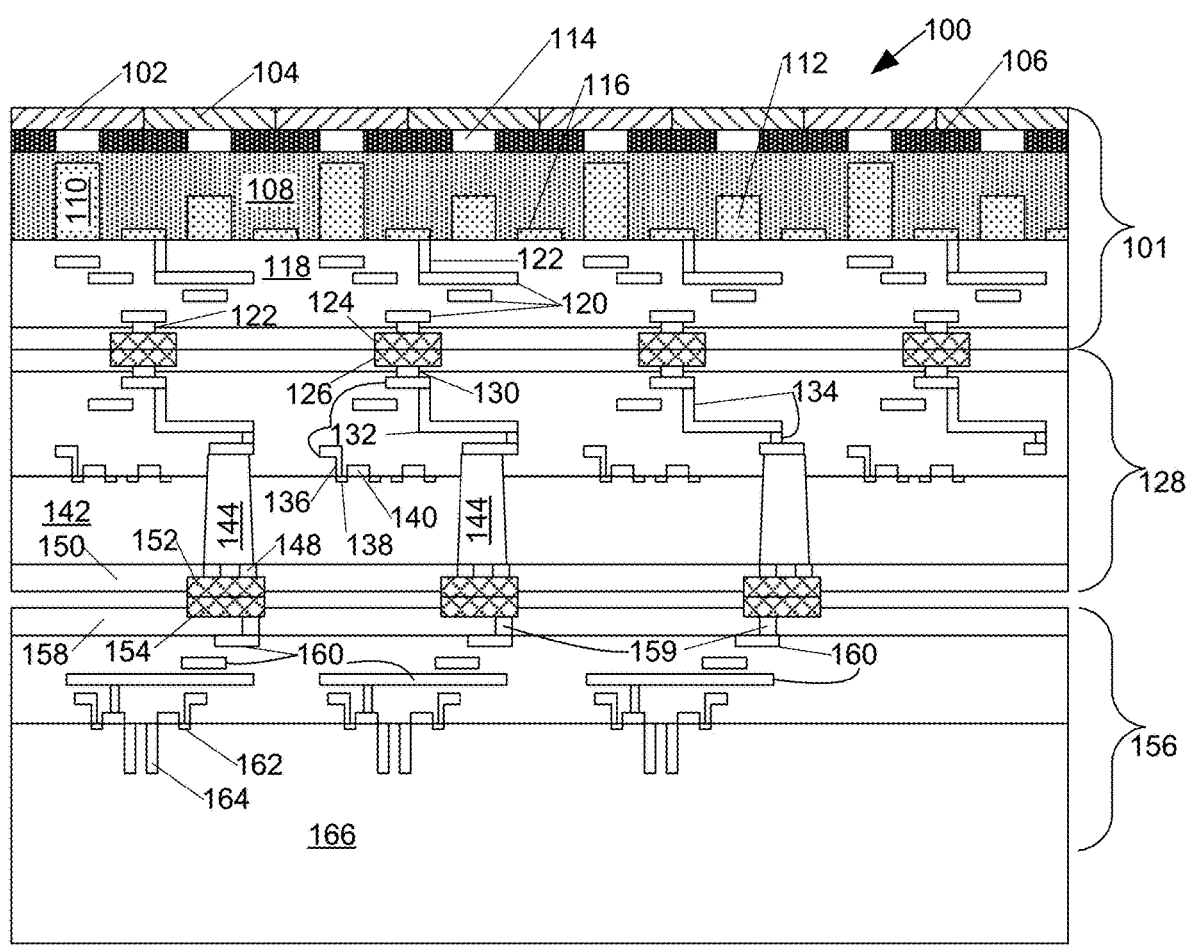
FIG. 1 is a schematic cross-section illustrating a three-integrated-circuit sandwich image sensor having pixel array, logic, and DRAM integrated circuits.

A three-layer sandwich image sensor 100 has a backside-illuminated (BSI) pixel die 101. BSI die may have a color filter layer with multiple types of color filter 102, 104, if present the color filter layer lies atop an opaque blackout mask 106 that prevents stray light from affecting non-pixel circuitry of the BSI pixel die, blackout mask 106 and color filters 102, 104 are deposited on a backside of a thinned silicon substrate 108. Within substrate 108 are formed pixels, which may be all of the same type and in other embodiments of multiple types 110, 112. The pixels 110, 112 lie beneath openings 114 in blackout mask 106. Also formed within substrate 108 are formed transistors having source and drain regions 116, such as pixel selection transistors.

Formed on the frontside of BSI pixel die 101 are gate regions (not shown) associated with pixels 110, 112 and transistor source and drain regions 116, as well as several layers of insulating dielectric 118 and metal interconnect 120 with associated contacts and vias (not shown). At predetermined inter-die connection or pad locations, a via 122 from metal interconnect 120 to a metal pixel inter-die bonding pad 124 is provided. Since each of multiple sub-arrays has an inter-die bonding pad 124, there are many inter-die bonding pads.

The metal pixel inter-die bonding pads 124 are bonded to upper inter-die bonding pads 126 on a front side of a logic integrated circuit 128. The upper inter-die bonding pads 126 are connected by vias 130 to one or more layers of interconnect metal 132 of logic integrated circuit 128, the layers of interconnect metal 132 being interconnected by suitable vias 134. Interconnect metal 132 is also coupled through contacts 136 to source and drain diffused regions 138 and polysilicon gate 140 structures formed in the front side logic integrated circuit's 128 silicon substrate 142. Also formed in silicon substrate 142 are through-silicon vias 144 insulated from substrate 142 and electrically coupled to first layer interconnect metal 132 of logic integrated circuit 128. Through silicon vias 144 also couple through vias 148 through backside insulation 150 to logic integrated circuit backside inter-die bonding pads 152.

Since each ADC converter has multiple outputs, there are multiple inter-die bonding pads 124 for each ADC, there are many inter-die bonding pads given there are separate inter-die bonding pads associated with each ADC.

The logic integrated circuit backside inter-die bonding pads 152 are bonded to DRAM bonding pads 154 of DRAM integrated circuit 156. DRAM bonding pads 154 are coupled by vias 159 through protective layers 158 to interconnect metal layers 160 of DRAM integrated circuit 156. DRAM integrated circuit 156 has transistors with source and drain diffusions 162 forming sense amplifiers, selection transistors, and decoders as known in the dynamic RAM industry, and may have additional circuitry. DRAM integrated circuit 156 also has trench capacitors 164, as known in the DRAM industry, formed into DRAM silicon substrate 166 as part of DRAM cells of DRAM memory arrays. In alternative embodiments, other forms (not shown) of DRAM cells as known in the DRAM art are used within DRAM integrated circuit 156 instead of cells based on trench capacitors, such as but not limited to stacked capacitor cells, cylindrical-capacitor cells, or even three-transistor cells.

Figure 2:
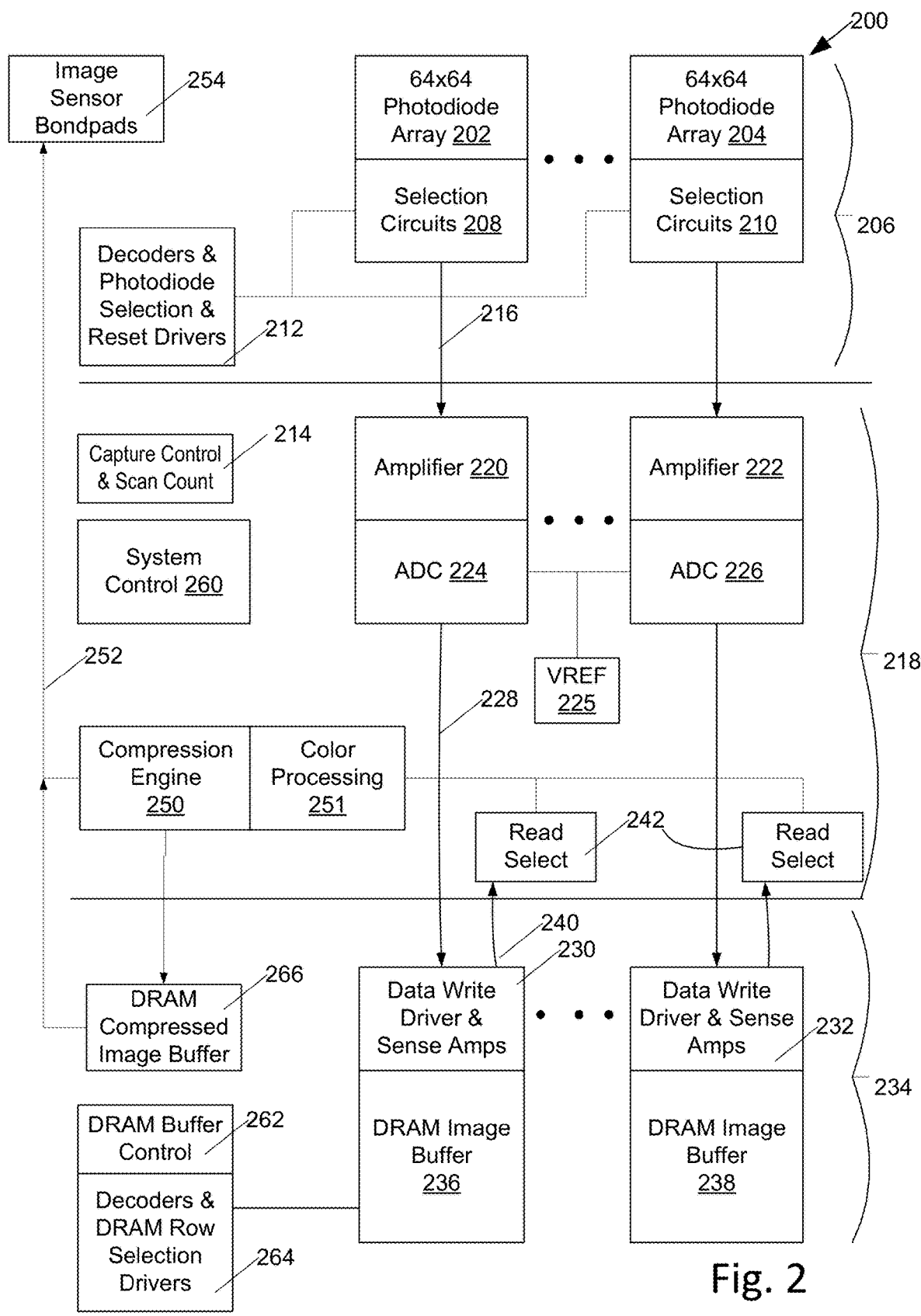
FIG. 2 is a block diagram illustrating blocks of the three-integrated-circuit sandwich image sensor having pixel array, logic, and DRAM integrated circuits that are important in capturing bursts of images.
Figure 3:
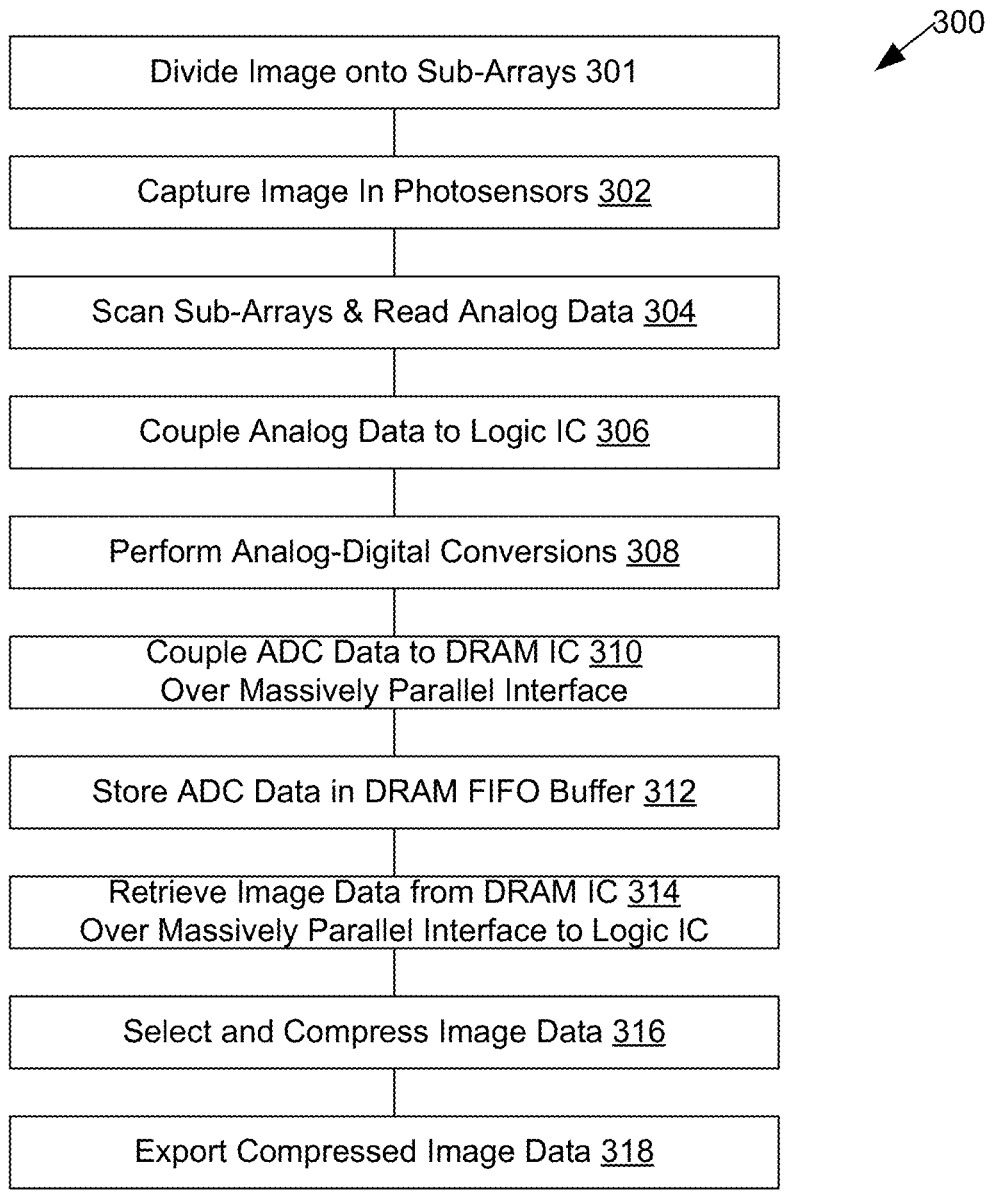
FIG. 3 is a flowchart illustrating a method of capturing a burst of high resolution images.

The three-integrated-circuit sandwich image sensor having pixel array, logic, and DRAM integrated circuits may be configured with functional units divided between the pixel array integrated circuit 206, logic integrated circuit, and DRAM integrated circuit in a variety of ways, in one particular embodiment 200 (FIG. 2) and with reference to the flowchart 300 of FIG. 3, a pixel array of, in particular embodiments 4160×3328 or 1920×1080 pixels is into 64×64 sub-arrays 202, 204 of pixels on the pixel array integrated circuit 206, each sub-array 202, 204 of pixels having associated selection circuits 208, 210 driven and controlled by on-chip decoders, selection and reset drivers 212 operating under control of image capture control and scan counters 214 on the logic IC. In an alternative embodiment, the selection and reset drivers 212 are located on the logic IC and decoded row select lines cross into the pixel IC.

Each image arriving at the pixel is divided onto sub-arrays 202, 204, such that each sub-array 202, 204 captures 302 a portion of the arriving image. The pixels of the sub-arrays are scanned 304 with selected analog pixel values from each sub-array are coupled 306 through a bond 216 from pixel array integrated circuit 206 to logic integrated circuit 218 where, in a particular embodiment, each 64×64 sub-array feeds a through buffer amplifiers 220, 222 to an input of separate twelve-bit ADCs 224, 226 for each sub-array. ADC' 224, 226 operate using a common current or voltage reference 225 to ensure all ADC's have similar ranges. After analog-to-digital conversion 308, data from the ADCs 224, 226 outputs couples 310 over twelve bonds 228 in parallel into DRAM write buffers 230, 232 on the DRAM integrated circuit 234 whereupon it is written into a first-in, first-out (FIFO) or first-in, random-out (FIRO) DRAM buffer 236, 238 implemented in DRAM. In a particular embodiment, DRAM buffer 236, 238 may hold only one full resolution image, in another embodiment DRAM buffer 236, 238 is sized and configured to operate as a DRAM buffer of thirty images so as to hold a full second of very high resolution video. Since data is provided to DRAM integrated circuit on 6120 bonds in parallel for a 1920×1080 array, or roughly 40K bonds in parallel for a 4160×3328 pixel array, either being a massively parallel interface, the logic circuit to DRAM interface is capable of very high data rates.

In alternative embodiments, compression engine 250 of logic IC 218 feeds compressed images into a compressed image buffer 266 implemented using DRAM-based storage and suitable control logic, compressed images from compressed image buffer 266 being readable to image sensor bondpads 254.

For each image, each ADC performs 4096 conversions. When capturing a burst of 30 images while using 12-bit ADC's, the DRAM buffers may receive 122K 6 k-bit or 40 k-bit data words from each 64×64 sub-array and store 312 this data into the DRAM.

Image data remains in DRAM buffers until it can be processed by color processing and image compression circuitry.

Once stored into the DRAM buffer 236, 238, image data may be read back or retrieved 314 through the sense amplifier side of write driver and sense amplifiers 230, 232 and through bonds 240 into readout selection circuitry 242 of the logic integrated circuit 218. In a particular embodiment, bonds 240, 228 are multiplexed on a single set of bonds to conserve die area.

Readout selection circuitry 242 retrieves 312 data from the DRAM buffer and selects particular sub-arrays of a row for sequential processing by color processing circuits 251 and compression engine 250 for image processing including color processing and compression 314, compressed image data is then transferred through additional bonds 252 on the pixel integrated circuit 206 for export 316 to other components of a system where the images may be stored or manipulated. In some embodiments, compressed image data may be temporarily stored in DRAM compressed image buffer 266 prior to being read out through additional bonds 252 on the pixel integrated circuit. In alternative embodiments, color processing circuits 251 and compression engine 250 are supplemented with circuitry configured to perform additional image processing functions. In additional alternative embodiments part or all of color processing circuits 251 and compression engine 250 are replaced by general purpose image processing circuits adapted to perform still and full-motion image compression as well as autofocus, color balance, red-eye detection and correction, electronic zoom, and other image processing functions as known in the electronic camera art.

Operation of the data path illustrated in FIG. 2 is controlled during image capture by system control 260 on the logic integrated circuit 218, while operation of the DRAM DRAM is controlled by address counters and other logic in DRAM buffer control 262, address counts from DRAM buffer control 262 are decoded and provided to the DRAM by decoders and DRAM row selection drivers 264.

The massively parallel interface over die-to-die bonds of logic IC to DRAM IC permit extraordinarily high data bandwidths despite relatively slow logic clock speeds.

OTP

In an alternative embodiment, a massively-parallel interface provided through direct die-to-die bonds, such as between the logic IC and the DRAM IC described with reference to FIGS. 1 and 2, may be used to permit floating-gate or nitride-layer one-time-programmable (OTP) memory on one integrated circuit layer to readily control operation of portions of both a logic IC and a stacked DRAM IC.

Figure 4:
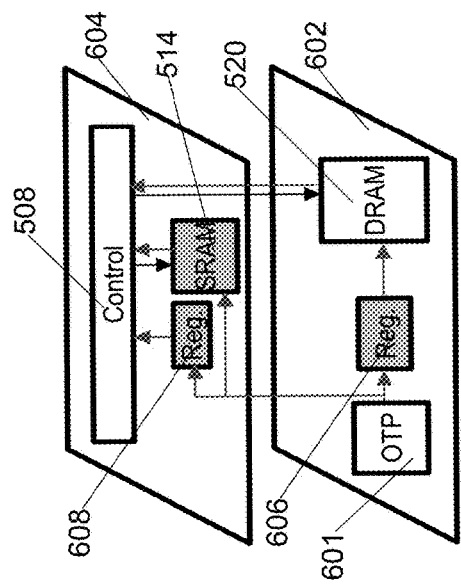
FIG. 4 is a block diagram illustrating a traditional use of OTP memory.

A 2-chip system having stacked ICs and inter-die bonds is illustrated in FIG. 4, with a DRAM IC 402 and logic IC 404. Both DRAM 402 and logic 404 ICs have OTP cells 406, 408, with both OTP cells buffered in registers 410, 412. The logic IC may have SRAM 414 as well as control logic 416, and the DRAM IC may have DRAM 418. This architecture requires OTP cells on both ICs, requiring additional complexity in processing the ICs.

Figure 6:
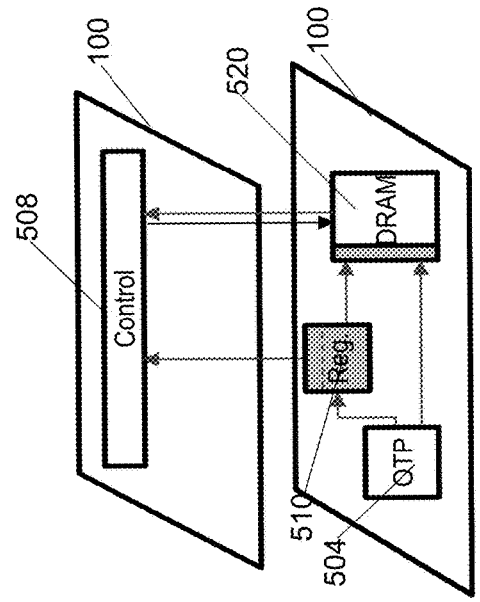
FIGS. 5, 6, and 7 are block diagrams illustrating how OTP memory confined to one layer of a multi-integrated-circuit sandwich can impact functions in multiple layers of the image sensor.
Figure 5:
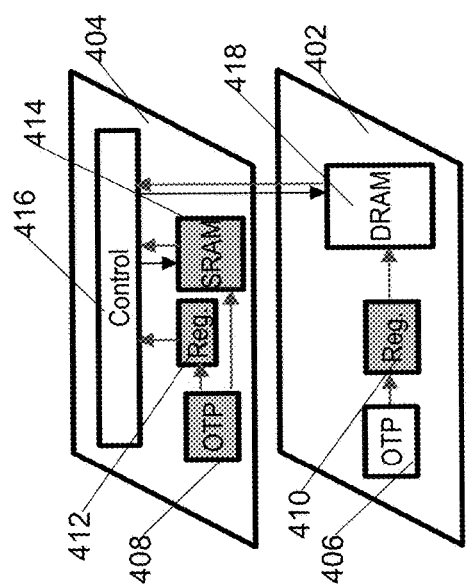
Figure 7:
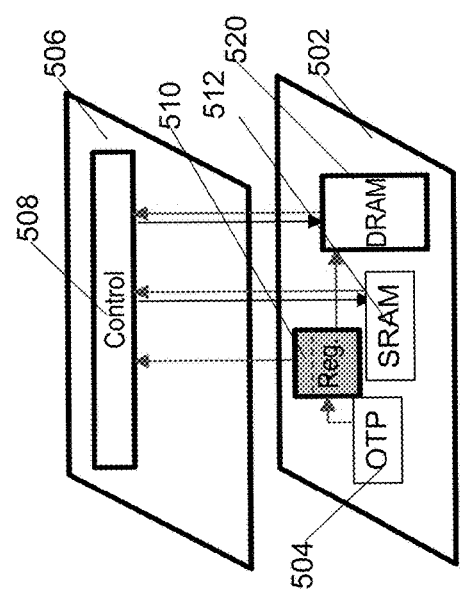

To reduce processing complexity, OTP cells 504 may be integrated on only one of the ICs, in the example illustrated in FIG. 5 the DRAM IC 502, the second IC of the stack, the logic IC 506, having control logic 508 that receives buffered OTP information from a register 510 on the DRAM IC 502 through die-to-die bonds similar to those illustrated in FIG. 1. The DRAM die typically includes DRAM. Additional SRAM 512, 514 (FIG. 6) may appear on either die. A variation having registers 606, 608 to buffer some of the OTP cells 601 on each of the DRAM IC 602 and logic IC 604, as appropriate for system needs, is illustrated in FIG. 6. In some embodiments, the OTP cells affect operation of the DRAM 520 itself, perhaps substituting defective columns or setting DRAM sizes for field programmable gate array systems.

Field programmable gate arrays (FPGAs) and other logic ICs having internal memory may benefit from an initial OTP-programmed configuration while allowing for optional reconfiguration into a run-time configuration during operation. Further, such FPGAs may greatly benefit from availability of large DRAM arrays that may be configured by users for use with either the OTP-programmed or run-time configurations. In such an embodiment, a two-IC sandwich similar to that illustrated in FIG. 1 is used, but formed without a pixel IC. In this embodiment, the logic IC is bonded with inter-die bonds to a DRAM integrated circuit, the logic IC being configured with its top as the top of the sandwich. In this embodiment, the logic IC may be bonded by flip-chip or wire-bond techniques to an integrated circuit package (not shown) in addition to being bonded with inter-die bonds to the DRAM IC.

OTP and DRAM

In a particular embodiment, the DRAM IC incorporates OTP memory cells associated with each ADC and sub-array of pixels, the memory cells containing bad-pixel data. In this embodiment, the bad-pixel data from the OTP memory is read into the logic IC when each image is read from the DRAM into the color processing circuits 251.

In this embodiment, defective pixels, or sensors of differing sensitivity, are identified during testing and their locations mapped into OTP memory. The defective pixels are then ignored during color processing, with nearby pixel readings used instead, in order to avoid color artifacts caused by the defective pixels.

In embodiments, the multi-IC sandwich image sensor may include additional DRAM arrays configured to store information other than, and supplementing, the raw and compressed image buffers herein described.

While the multi-IC sandwich image sensor has been described with reference to the pixel IC being above and bonded with inter-die bonds to the logic IC and the logic IC being above and bonded with inter-die bonds to the DRAM IC, in an alternative embodiment the pixel IC is above and bonded with inter-die bonds to the DRAM IC and the DRAM IC is above and bonded with inter-die bonds to the logic IC.

Combinations of Features

Features herein described may be combined in a multitude of ways. For example, the OTP memory may be located on either the logic IC or on the DRAM IC. Additional combinations are disclosed below.

In an embodiment designated A, a multiple integrated-circuit (IC), buffered, image sensor has a first IC with an array of pixels, selection transistors, and interconnect, some of the interconnect coupled to selection transistors and to first inter-die bond pads; a second IC with logic transistors and analog-to-digital converters (ADCs), the ADCs having inputs coupled to second inter-die bond pads through interconnect, and outputs coupled by through-silicon vias to third inter-die bond pads; and a third IC with dynamic RAM (DRAM) coupled to receive and buffer data in the DRAM from fourth inter-die bond pads. The image sensor has the first inter-die bond pads bonded to the second inter-die bond pads and the third inter-die bond pads bonded to the fourth inter-die bond pads.

In an embodiment designated AA including the embodiment designated A, there are multiple third inter-die bond pads for each ADC, and a single second inter-die bond pad for each ADC.

In an embodiment designated AB including the embodiment designated A or AA the array of pixels is divided into multiple sub-arrays each sub-array coupled to a separate ADC of the ADCs, and wherein the DRAM buffers data from the ADCs.

In an embodiment designated AC including the embodiment designated A, AA, or AB the DRAM buffers are configured as a multi-image DRAM buffer.

An embodiment designated AD including the embodiment designated A, AA, AB, or AC further including a compressed image buffer in the third IC.

An embodiment designated AE including the embodiment designated AD, where the compressed image buffer in the third IC incorporates DRAM cells.

An embodiment designated AF including the embodiment designated A, AA, AB, AC, AD, or AE, the second IC incorporating one-time-programmable (OTP) memory cells, the OTP memory cells coupled to affect operation of the second and third ICs.

An embodiment designated AG including the embodiment designated A, AA, AB, AC, AD, or AE, the third IC incorporating one-time-programmable (OTP) memory cells, the OTP memory cells coupled to affect operation of the second and third ICs.

In another embodiment designated B, a method includes receiving an image onto an array pixel IC, the array pixel IC having an array of pixels divided into a plurality of sub-arrays of pixels; capturing the image as image data in pixels of the sub-arrays, where each sub-array feeds a separate, associated, ADC through an inter-die bond, the ADCs located on a logic IC. The method also includes scanning the sub-arrays and reading the image data from the sub-arrays into the associated ADCs to convert the image data to digital image data; and transferring the digital image data over inter-die bonds and buffering the digital image data in dynamic RAM (DRAM).

A method designated BA includes the method designated B and includes reading the digital image data over inter-die bonds into the logic IC; and performing image compression and/or color processing.

A method designated BB includes the method designated B or BA and testing the array pixel IC to determine bad pixels; programming information of bad pixels into one time programmable (OTP) memory; reading the information of the bad pixels from the OTP memory; and using the information of the bad pixels during color processing.

A method designated BC includes the method designated BB and transferring the information of bad pixels across inter-die bonds.

A method designated BD including the method designated B, BA, or BC, further comprising testing DRAM cells to identify bad cells and programming information regarding the bad cells into OTP memory.

In an embodiment designated C, a multi-integrated-circuit device includes a logic IC and a DRAM IC, the logic IC bonded by inter-die bonds to the logic IC, a one-time-programmable (OTP) IC selected from the group consisting of the DRAM IC and the logic IC includes OTP memory, the multi-integrated-circuit device configured such that contents of the OTP memory affects operation of both the logic IC and the DRAM IC.

In an embodiment designated CA including the embodiment designated C, the DRAM IC includes the OTP memory and buffered OTP data is transferred to the logic IC.

In an embodiment designated CB the logic IC includes the OTP memory and buffered contents of the OTP memory is transferred to the DRAM IC.

In an embodiment designated CC including the embodiment designated C, CA, or CB, the multi-integrated-circuit device further includes a pixel IC comprising photodiodes, the pixel IC bonded by inter-die bonds to an IC selected from the group consisting of the logic IC and the DRAM IC.

In an embodiment designated CD including the embodiment designated C, CA, or CB, the multi-integrated-circuit device implements a field-programmable gate array (FPGA) including DRAM arrays configurable for use within the FPGA, and wherein the OTP memory provides at least an initial configuration for the FPGA.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A multiple integrated-circuit (IC), buffered, image sensor comprising:
a first IC further comprising an array of pixels, the array of pixels divided into a plurality of sub-arrays of pixels, each sub-array of pixels further comprising selection transistors
each sub-array of pixels coupled through inter-die bonds to provide analog pixel data to a separate analog-to-digital converter of a plurality of analog-to-digital converters (ADCs) located on a second IC further comprising logic transistors, the ADCs having outputs coupled by through-silicon vias to a third IC through inter-die bonds, the second IC incorporating image processing circuitry adapted to perform color processing and at least image compression;
the third IC further comprising dynamic RAM (DRAM) coupled to receive and buffer image data in the DRAM from the ADCs on the second IC and to provide image data to the image processing circuitry on the second IC;
the third IC further comprising a one-time-programmable (OTP) memory configured to provide a bad cell map to the DRAM and to provide buffered bad-pixel data to the image processing circuitry on the second IC.

2. The image sensor of claim 1 wherein there are a plurality of die bonds to the third IC for each ADC output, and a single inter-die bond to the first IC for each ADC input.

3. The image sensor of claim 1 wherein the DRAM buffers data from the ADCs.

4. The image sensor of claim 3 wherein the DRAM buffers are configured as a multi-image buffer.

5. The image sensor of claim 4 further comprising a compressed-image buffer within the third IC.

6. The image sensor of claim 5 where the compressed image buffer is implemented using DRAM cells.

7. The image sensor of claim 4, the second IC incorporating one-time-programmable (OTP) memory cells, the OTP memory cells coupled to affect operation of the second and third ICs.

8. The device of claim 7 wherein the third IC further comprises registers that buffer output of the OTP cells.

9. The device of claim 7 wherein the third IC further comprises static RAM (SRAM).

10. A method comprising:
receiving an image onto an array pixel IC, the array pixel IC having an array of pixels divided into a plurality of sub-arrays of pixels;
capturing the image as image data in pixels of the sub-arrays of pixels, where each sub-array is coupled to a separate, associated, analog-to-digital converter of a plurality of analog to digital converters through at least one inter-die bond, the analog to digital converters located on a logic IC;
scanning the sub-arrays of pixels and reading the image data from pixels of the sub-arrays into the associated analog-to-digital converters and converting the image data to digital image data;
reading a one-time-programmable (OTP) memory on a dynamic RAM (DRAM) IC separate from the array pixel IC and the logic IC to determine a mapping of bad cells in a dynamic random-access memory (DRAM) located on the DRAM IC;
transferring the digital image data over inter-die bonds and buffering the digital image data in the DRAM;
reading the OTP memory, and buffering data from the OTP memory on the DRAM IC, to obtain a mapping of bad pixels in the array of pixels on the array pixel IC and providing the mapping of bad pixels to imaging processing circuitry on the logic IC;

and reading the digital image data from the DRAM on the DRAM IC over inter-die bonds into the image processing circuitry on the logic IC and performing image processing.

11. The method of claim 10 further comprising:
testing the array pixel IC to determine the mapping of bad pixels;
programming information of the bad pixels into the one time programmable (OTP) memory; and
using the information of the bad pixels during color processing.

12. The method of claim 11 further comprising transferring the information of bad pixels across inter-die bonds.

13. The method of claim 10, further comprising testing DRAM cells of the DRAM to identify bad cells and programming information regarding the bad cells into OTP memory.

14. The device of claim 10 further comprising a pixel IC comprising photodiodes, the pixel IC bonded by inter-die bonds to an IC selected from the group consisting of the logic IC and the DRAM IC.

15. A multi-integrated-circuit imaging device comprising a pixel array IC, a logic IC and a dynamic random access memory (DRAM) IC, the pixel array IC being bonded by inter-die bonds to the logic IC and the DRAM IC being bonded by inter-die bonds to the logic IC, a one-time-programmable (OTP) memory fabricated on an IC selected from the group consisting of the DRAM IC and the logic IC, the multi-integrated-circuit device configured such that contents of the OTP memory is buffered to provide a mapping of bad pixel data to affect operation of image processing circuitry on the logic IC, and contents of the OTP memory is buffered to provide bad-cell data to affect operation of the DRAM on the DRAM IC;
the pixel array IC having an array of pixels divided into a plurality of sub-arrays of pixels where each sub-array is coupled to a separate, associated, analog-to-digital converter of a plurality of analog to digital converters located on the logic IC.

16. The multi-integrated-circuit device of claim 15 wherein the logic IC includes the OTP memory and buffered contents of the OTP memory is transferred to the DRAM IC.

17. The multi-integrated-circuit device of claim 15 wherein the multi-integrated-circuit device implements a field-programmable gate array (FPGA) including DRAM arrays configurable for use within the FPGA, and wherein the OTP memory provides at least an initial configuration for the FPGA.

* * * * *